United States Patent [19]

Everswick

[11] 4,112,317
[45] Sep. 5, 1978

[54] PULSE AMPLITUDE AND WIDTH DETECTION SYSTEM

[75] Inventor: David N. Everswick, Succasunna, N.J.

[73] Assignee: The United States of America as represented by the Secretary of the Army, Washington, D.C.

[21] Appl. No.: 793,820

[22] Filed: May 5, 1977

[51] Int. Cl.² .................... H03K 5/153; H03K 5/18
[52] U.S. Cl. .................................. 307/308; 73/517 R; 307/234; 307/362; 328/111; 328/115; 328/1
[58] Field of Search ............... 307/234, 362, 363, 308, 307/9; 328/111, 112, 115, 1; 73/517 R; 102/70.2 GA

[56] References Cited

U.S. PATENT DOCUMENTS

| 3,493,782 | 2/1970 | Georgi | 307/362 |
| 3,676,699 | 7/1972 | Warren | 307/234 |
| 3,879,662 | 4/1975 | Barneck | 307/362 X |

Primary Examiner—John Zazworsky
Attorney, Agent, or Firm—Nathan Edelberg; A. Victor Erkkila; Max Yarmovsky

[57] ABSTRACT

A pulse detection system comprises, in series, a pulse amplitude detector, a pulse width detector and a recorder. The pulse amplitude detector comprises a voltage comparator having an input for receiving a voltage pulse, a reference d.c. voltage input, a ground and an output for producing an output voltage when the input pulse equals a predetermined fraction of the reference voltage. The pulse width detector comprises a positively-triggered monostable having: a trigger input connected to the comparator output, a ground, a RESET, a RESET reference, a reference d.c. voltage input connected through a resistor to the RESET and through a capacitor to the RESET reference, and a $\bar{Q}$ output; and a positive-going clocked flip-flop having a clock input connected to the $\bar{Q}$ output of the monostable, a data input connected to the comparator output, a ground, a reference d.c. voltage input, a RESET, and a Q output connected through a delay resistor to the RESET and through a capacitor to ground. The recorder is a conventional digital counter.

6 Claims, 4 Drawing Figures

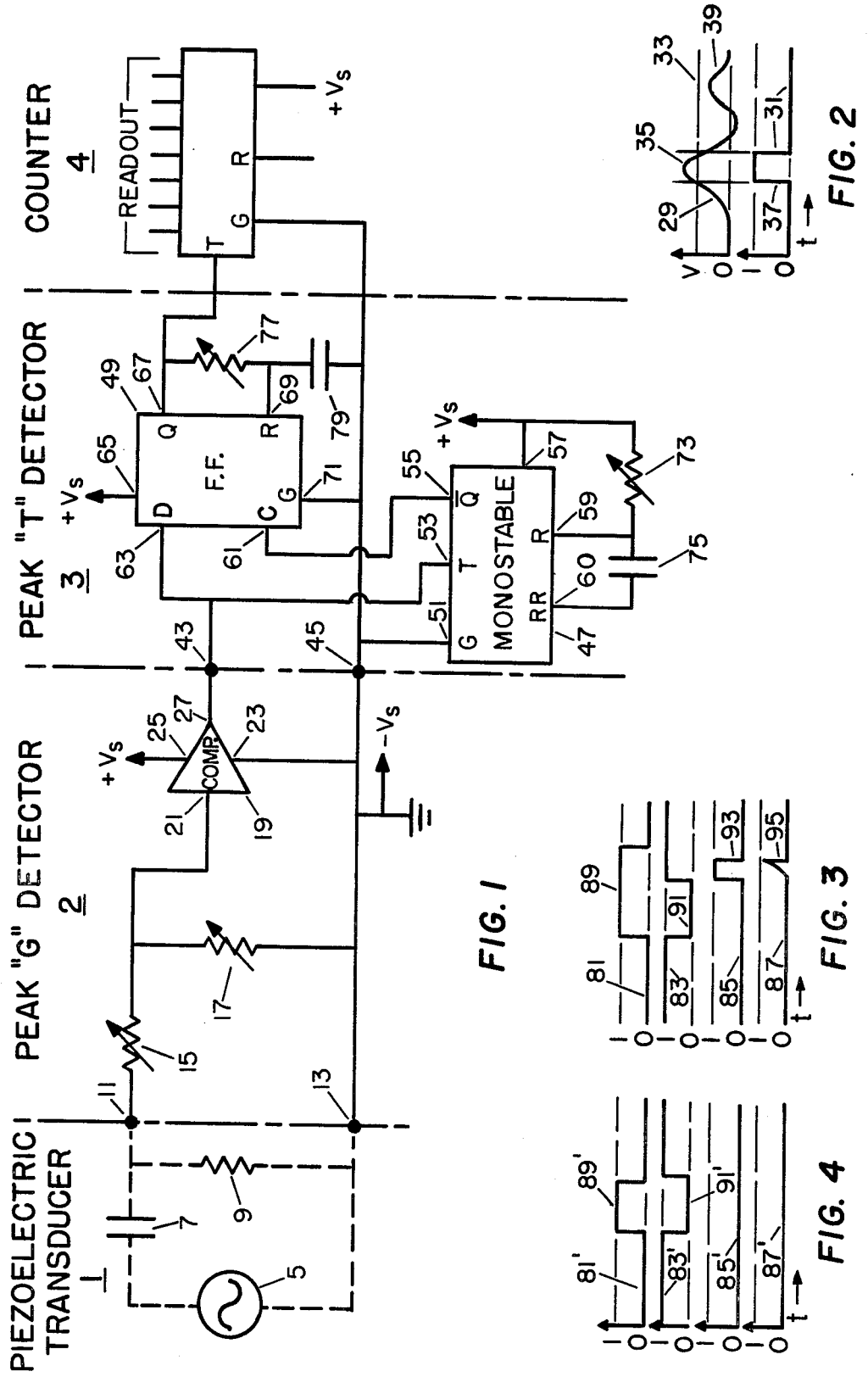

4,112,317

PULSE AMPLITUDE AND WIDTH DETECTION SYSTEM

GOVERNMENTAL INTEREST

The invention described herein may be manufactured, used and licensed by of for the Government for governmental purposes without the payment to me of any royalty thereon.

BACKGROUND AND SUMMARY OF THE INVENTION

The present invention relates to a system for detecting and recording voltages or voltage pulses of predetermined amplitude and/or time duration, and to the use of such system for monitoring the environmental "G" forces experienced by a given munition or other device during a given time.

One of the major problems in the development of munitions has been the inability to obtain satisfactory data on the actual field transportation environment the item experiences from point of origin to point of end use. Without this data it is very difficult to specify with any confidence the ideal design and performance specifications. As a result, most munitions are over-designed and often unnecessarily rejected during production tests. This has reduced the overall cost effectiveness of munition programs. In the past, the only way to estimate the field environment was to perform an extensive and costly series of worst case laboratory tests.

In accordance with the invention, a small self-contained package, containing a piezoelectric transducer, a detection and recording circuit and battery, is designed to be implaced within an explosive shell, for example, to monitor and record all environmental G forces of given amplitude and/or time duration that the shell is subjected to during a given time. Any conventional small piezoelectric transducer may be used. The detection and recording circuit comprises a novel circuit for detecting each voltage pulse from the piezoelectric transducer that is at least equal to a predetermined amplitude, and/or a novel circuit for detecting each voltage pulse that has a time width at least equal to a predetermined width, and means for recording the detected pulses. The amplitude detection means comprises a pair of input terminals, two resistors, a voltage comparator, and means connecting the two resistors in series and parallel with the input terminals and comparator. The pulse width detection circuit comprises a pair of input terminals, a positively-triggered monostable, a positive-triggered clock flip-flop, and suitable connecting means. Preferably, the flip-flop is provided with an RC means for automatically terminating the output pulse after a predetermined delay. The detected pulses are recorded by a digital counter.

BRIEF DESCRIPTION OF THE DRAWING

FIG. 1 is a schematic circuit diagram of an apparatus or system embodying the invention.

FIG. 2 is a schematic diagram showing the input and output voltage wave forms on the comparator in FIG. 1.

FIGS. 3 and 4 are schematic diagrams showing four voltage wave forms on the flip-flop of FIG. 1, under two different conditions.

DETAILED DESCRIPTION OF A PREFERRED EMBODIMENT

The circuit of FIG. 1 is divided, by vertical dash-dot lines, into four portions, namely, a piezoelectric transducer 1, a peak "G" detector 2, a peak "T" detector 3, and a binary counter 4. The transducer 1 comprises a piezoelectric cell or device 5, a series capacitor 7, and a shunt resistor 9 capable of generating a voltage pulse across terminals 11 and 13 in response to mechanical shock.

The peak "G" detector 2 includes two input terminals 11 and 13, adapted to be connected to the transducer 1, two resistors 15 and 17 and a voltage comparator 19. A first adjustable resistor 15 is connected in series with terminal 11 and the comparator input 21; terminal 13 is connected to the comparator ground 23; and resistor 17 is shunted across the comparator input 21 and ground 23. The comparator 19 also includes a reference potential terminal 25, adapted to be connected to a reference voltage $V_s$ of positive potential, and an output terminal 27. The comparator 19, which may be one-sixth of an RCA CD4050A buffer gate, or equivalent, is adapted to produce an output signal in response to an analog input potential at least equal to a predetermined fraction of the reference potential applied thereto. Heretofore, the CD4050A has been limited to non-inverting hex buffers used for CMOS-to-DTL/TTL converters, current "sink" or "source" drivers and high-to-low logic-level converters. The peak "G" detector 2 uses the CD4050A to compare the input 21 and the reference potential at 25 with the non-inverting output 27 referenced to ground 23. In FIG. 1, when the input potential at 21 exceeds a certain fraction of the power supply potential at 25, which is the threshold of the device, the output of the device goes high, very nearly equal to the reference potential at 25. The output at 27 remains high until the input potential at 21 is less than threshold, at which time the output will fall low (very near ground potential). Resistors 15 and 17 are set, or adjusted, to scale the input at 11 to a desired "G" level threshold.

FIG. 2 shows a typical input wave 29 at comparator input 21, and the resulting output pulse waveform 31 at output terminal 27. The threshold input potential is indicated by the horizontal dashed line 33. As shown, the portion of the large amplitude input pulse 35 intercepted by the threshold line 33 produces an output pulse 37 of the same width, while the low amplitude pulse 39 produces no output pulse. Thus, the peak "G" detector 2 responds to, or detects, only those input pulses having an amplitude equal to or greater than the selected threshold potential. The detected pulses may be recorded by a digital counter connected to terminals 27 and 23. The circuit 2 draws extremely low current from the power supply and will work for months on a small button cell battery. The circuit, in essence, turns itself on only when an acceptable pulse (above threshold) is applied thereto and remains off at all other times.

The peak "T" or pulse width detector 3 includes two input terminals 43 and 45, which may be connected to the terminals 27 and 23, respectively, of the peak "G" detector 2, or other source of input pulses, a positively-triggered monostable 47, and a clocked flip-flop 49 such as Model No. CD 4013 as manufactured by RCA. The monostable 47, which may be one-half of an RCA CD4098 monostable, includes a ground 51, a trigger input 53, a $\overline{Q}$ output 55, a d.c. supply terminal 57, a RESET 59, and a RESET reference 60. The flip-flop 49, which may be any clocked flip-flop that is triggered by a positive or positive-going voltage transition, includes a clock or trigger input 61, a data (or set) input 63, a d.c. supply terminal 65, a Q output 67, a RESET 69, and a ground 71. The pulse input terminal 43 is connected to both the trigger input 53 of the monostable 47 and the data input 63 of the flip-flop 49; the ground input terminal 45 is connected to the grounds 51 and 71; the monostable ouput 55 is connected to the clock input 61 of the flip-flop; and terminals 57 and 65 are connected to the power supply $V_s$. A resistor 73 is connected between the monostable terminal 57 and the RESET 59 and shunted to the RESET reference 60 by a capacitor 75. Preferably, a feedback resistor 77 is connected between the flip-flop output 67 and the RESET 69, and shunted to ground by a capacitor 79.

The truth table for the flip-flop potentials is as follows:

| C | D | R | Q | Q' |
|---|---|---|---|----|
|   | 0 | 0 | 0 | 0  |
| ⌐ | 1 | 0 | 0 | 1  |
| ⌐ | 1 | 0 | 1 | 0  |
| ⌐ | X | 0 | Q | Q  |

Where C is the clock input, D is the data input, R is the RESET, Q is the output before the pulse is applied, Q' is the output after the pulse, 0 is logical ZERO, 1 is logical ONE, the symbol ⌐ means a positive-going transition, the symbol ⌐ means a negative-going transition, and X means immaterial (0 or 1).

In operation, in the absence of a positive input pulse from input terminal 43, the monostable trigger terminal 53 is at a negative or logical ZERO potential and the output 55 is positive or logical ONE. Also, the flip-flop data input is a ZERO and the clock input is a ONE. Since the two inputs are not both ONE, the flip-flop does not trigger, so the output at 67 is a ZERO. At the instant that a positive ONE pulse is applied to trigger input 53, the monostable output 55 goes low and remains low for a fixed period of time, determined by the R-C circuit 73-75, at the end of which it switches back to a ONE. During this period, the RESET terminal 59 is less than the necessary RESET voltage. When terminal 59 reaches the RESET voltage, the monostable 47 reverts back to its initial condition, producing a ONE at its output 55. If, at the end of this period the input pulse (from the comparator) at input 63 is still high, the flip-flop triggers, producing a positive pulse at the output 67. In order to automatically terminate this output pulse in a short time, to reset the flip-flop for detecting the following input pulse, the resistor 77 is connected between the output 67 and the RESET 69, shunted to ground by the capacitor 79. On the other hand, if the input pulse at 63 has terminated at the time that the monostable output 55 goes positive, the flip-flop does not trigger, and hence no output pulse is produced at 67. This operation is illustrated in FIGS. 3 and 4. FIG. 3 shows four waveforms 81, 83, 85 and 87, representing the variation with time of the potentials at 53, 55, 67 and 69, respectively. The input pulse is shown at 89, and the monostable pulse is shown at 91. The flipflop output pulse on output 67 is shown at 93, and the transient pulse on the RESET 69 is shown at 95. FIG. 4 shows four waveforms 81', 83', 85', and 87' for the condition where the input pulse 89' is shorter or narrower than the monostable pulse 91', and hence, is rejected by the peak "T" detector 3.

The pulses accepted by the peak "T" detector 3 may be recorded by any conventional means, such as the digital counter 4 having a clock or trigger input T connected to the output 67, a ground terminal G connected to terminal 45, and the d.c. power supply $V_s$.

It will be understood that either the peak "G" detector 2 or the peak "T" detector 3 may be used without the other to perform its function. Where both are used in series with a piezoelectric transducer, as shown in FIG. 1, if the output of the transducer, scaled down by resistors 15 and 17, exceeds the threshold of the comparator 19 for a time period greater than the fixed time period of the monostable 47, a pulse is produced at the flip-flop output 67, which increments the counter 4 by one count. The counter 4 keeps a running count of the number of shocks that exceed both the "G" and "T" thresholds.

Low power digital CMOS integrated circuits can be used for the various electronic components. In the absence of input pulses, the only power drawn by the monostable 47 is its low quiescent power consumption. Also, where the "G" forces are widely spaced apart in time, the power drains of the flip-flop 49 and counter 4 are very low. Therefore, the apparatus has a battery-powered operational life of at least a year. The solid state components not only can withstand the severe field environment of munitions but also make it possible to fabricate a miniature package.

At any time, the counter 4 can be interrogated and the recorded count of above-threshold impacts read out.

The foregoing disclosure and drawings are merely illustrative of the principles of this invention and are not to be interpreted in a limiting sense. I wish it to be understood that I do not desire to be limited to the exact details of construction shown and described, because obvious modifications will occur to a person skilled in the art.

What is claimed is:

1. A detection system comprising:
   a piezoelectric transducer means for measuring shock and generating output pulses in response thereto,
   CMOS circuit means, connected to said transducer means, for detecting each pulse having an amplitude at least equal to a predetermined amplitude
   said CMOS circuit means being adapted to produce an output signal in response to an analog input potential at least equal to a predetermined fraction of a reference potential applied thereto;
   means, connected to the output of said pulse amplitude detecting means, for detecting each pulse having a time width at least equal to a predetermined width at said predetermined amplitude; and
   means, connected to the output of said pulse width detecting means, for recording said detected pulses.

2. A detection system as in claim 1, wherein said pulse width detecting means includes:
   a monostable comprising a trigger input connected to said output of said pulse amplitude detecting means, and a $\overline{Q}$ output; said monostable being adapted, when triggered by a positive pulse from said pulse amplitude detecting means, to produce a negative pulse of predetermined time width at its $\overline{Q}$ output; and a clocked flip-flop comprising a first input connected to said output of said amplitude detecting means, a clock input connected to said output of said monostable, and an output connected to said pulse recording means; said flip-flop having the following truth table:

| C | D | Q | Q' |
|---|---|---|---|
| ⌐⌐ | 0 | 0 | 0 |
| ⌐⌐ | 1 | 0 | 1 |
| ⌐⌐ | X | Q | Q | where C is the clock input voltage, D is the first input voltage, Q is the output voltage before the pulse, Q' is the output voltage after the pulse, 1 is logical ONE, 0 is logical ZERO, the symbol ⌐ means a positive-going pulse, the symbol ⌐ means a negative-going pulse, and X means immaterial.

3. A detection system as in claim 2, wherein said flip-flop further comprises:
   a RESET terminal connected through a resistor to said flip-flop output; and
   a capacitor connected between said RESET and said flip-flop ground terminal;
   for automatically terminating the output pulse after a predetermined time.

4. A detection system as in claim 2, wherein said pulse recording means comprises a binary counter.

5. Apparatus for detecting voltage pulses having a time width at least equal to a predetermined width, including:
   a monostable circuit comprising a trigger input adapted to be connected to a source of voltage pulses, a ground terminal, and a Q output; said monostable circuit being adapted, when triggered by a positive pulse from said source, to produce a negative pulse of predetermined time width at the output thereof, which includes;

a reference voltage terminal adapted to be connected to a source of positive reference potential;
   a RESET terminal;
   a RESET reference terminal;
   a resistor connected between said reference voltage terminal and said RESET terminal; and
   a capacitor connected between said RESET terminal and said RESET reference terminal; and
   a clocked flip-flop comprising a first input connected to said source, a clock input connected to said output of said monostable circuit, a ground terminal connected to said ground terminal of said monostable circuit, and an output terminal, wherein an output pulse is generated intermediate said ground terminal and said output terminal; said flip-flop having the following truth table:

| C | D | Q | Q' |
|---|---|---|---|
| ⌐⌐ | 0 | 0 | 0 |
| ⌐⌐ | 1 | 0 | 1 |
| ⌐⌐ | X | Q | Q | where C is the clock input voltage change, D is the first input voltage, Q is the output voltage before the pulse, Q' is the output voltage after the pulse, 1 is logical ONE, 0 is logical ZERO, the symbol ⌐ means a positive-going pulse, the symbol ⌐ means a negative-going pulse, and X means immaterial, which includes;
   means for automatically terminating the output pulse after a predetermined time.

6. Apparatus as in claim 5, wherein said means for automatically terminating said output pulse after a predetermined time comprises:
   a RESET terminal connected through a resistor to said output terminal of said clocked flip-flop; and
   a capacitor connected between said RESET and said ground terminals.

* * * * *